US011591516B2

(12) United States Patent
Saparov et al.

(10) Patent No.: US 11,591,516 B2
(45) Date of Patent: Feb. 28, 2023

(54) LUMINESCENT GROUP 1A COPPER HALIDES AND USES THEREOF

(71) Applicant: The Board of Regents of the University of Oklahoma, Norman, OK (US)

(72) Inventors: Bayram Saparov, Norman, OK (US); Tielyr D. Creason, Norman, OK (US); Rachel M. Roccanova, Frisco, TX (US); Aymen Yangui, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 0 days.

(21) Appl. No.: 17/063,438

(22) Filed: Oct. 5, 2020

(65) Prior Publication Data

US 2021/0115329 A1    Apr. 22, 2021

Related U.S. Application Data

(60) Provisional application No. 62/910,699, filed on Oct. 4, 2019.

(51) Int. Cl.

| C09K 11/61 | (2006.01) |
|---|---|
| C01G 3/00 | (2006.01) |
| G01N 21/64 | (2006.01) |
| H01L 33/50 | (2010.01) |
| G07D 7/00 | (2016.01) |

(52) U.S. Cl.
CPC ............ C09K 11/616 (2013.01); C01G 3/006 (2013.01); G01N 21/6486 (2013.01); G07D 7/003 (2017.05); H01L 33/502 (2013.01); C01P 2002/34 (2013.01)

(58) Field of Classification Search
CPC ...... C09K 11/616; C09K 11/58; G07D 7/004; C01G 3/006; G01N 21/6486
See application file for complete search history.

(56) References Cited

U.S. PATENT DOCUMENTS

| 4,343,781 | A  | * | 8/1982 | Sardisco ................. C01G 3/05 423/32 |
|---|---|---|---|---|
| 8,586,931 | B2 | * | 11/2013 | Horie ..................... G01T 1/202 250/361 R |
| 8,803,099 | B2 | * | 8/2014 | Shibutani ............. C09K 11/616 250/361 R |
| 9,315,913 | B2 | * | 4/2016 | Sekimoto .............. C25B 11/077 |
| 2016/0149145 | A1 | * | 5/2016 | Mhaisalkar ......... H01L 51/0091 136/263 |

FOREIGN PATENT DOCUMENTS

| CN | 110117024 | * | 8/2019 |
|---|---|---|---|
| CN | 110165000 | * | 8/2019 |

OTHER PUBLICATIONS

Translation for CN 110165000, Aug. 23, 2019.*
Translation for CN 110117024, Aug. 13, 2019.*
CA ab No. 123:126261,"Optical spectra and excitons in ternary (Rbl)1-x(Cul)x compunds", 1995.*
Yang et al., "Lead-Free Halide Rb2CuBr3 as Sensitive X-ray Scintillator", Adv. Mater., 2019, 31, 1904711, p. 1-8, Sep. 18, 2019.*
Huii et al., "Crystal structure and ionic conductivities of ternary derivatives o the silver and copper monohalides-II:ordered phase within the (AgX)x-(Mx)1-x and (CuX)x-(Mx)1-x (M=K,Rb and Cs; X=Cl,Br and I) systems", Journal of Solid State Chemistry, 177 (2004), pp. 3156-31.73, Jul. 15, 2004.*

* cited by examiner

*Primary Examiner* — C Melissa Koslow
(74) *Attorney, Agent, or Firm* — Dunlap Codding, P.C.

(57) ABSTRACT

High photoluminescence, high stability, inorganic perovskite compounds comprising an alkali metal selected from potassium (K), rubidium (Rb), and cesium (Cs); copper (Cu); and at least one halogen selected from chlorine (Cl), bromine (Br), and iodine (I). The perovskites may be free of lead (Pb). The inorganic perovskite compound may be used in an optoelectronic device. The optoelectronic device optionally contains a phosphor such as a blue-emitting phosphor. The inorganic perovskite compound may be used as an anti-counterfeiting nanotaggant applied on or within an object that susceptible to counterfeiting to enable confirmation of an authentic object.

11 Claims, No Drawings

LUMINESCENT GROUP 1A COPPER HALIDES AND USES THEREOF

CROSS-REFERENCE TO RELATED APPLICATIONS

This application claims priority under 35 USC § 119(e) (and 35 USC § 21(b)) to U.S. Provisional Application Ser. No. 62/910,699, filed on Oct. 4, 2019. The entire contents of the above-referenced patent(s) and patent application(s) are hereby expressly incorporated herein by reference.

STATEMENT REGARDING FEDERALLY SPONSORED RESEARCH OR DEVELOPMENT

This invention was made with government support under U.S. Department of Energy Contract No. DE-AC05-00OR22725. The government has certain rights in the invention.

BACKGROUND

The United States Department of Energy (DOE) projects an estimated energy cost savings of $630 billion from 2015 to 2035 if reliable, solid-state lighting technologies can be developed and DOE goals are met. For the cost-effective implementation of light-emitting diodes (LEDs), there has been an urgent need for the development of new inexpensive light emitters. Metal halide perovskite LEDs (PeLEDs) have been attracting increased attention in recent years due to their outstanding photophysical properties, including tunable band gaps and emission colors, high photoluminescent quantum yields (PLQY), and excellent color purity. High external quantum efficiency (EQE) green and near-infrared (NIR) light-emitting PeLEDs have already been developed, including a recent report of a NIR-emitting PeLED with a high EQE of 21.6%. However, the development of efficient blue-emitting halides has historically lagged behind. Blue-emitting lead perovskites, for example, usually suffer from the disadvantages of lead toxicity and poor stability.

A number of similar materials have been proposed for display applications, LED bulbs, and anti-counterfeiting labels. While most of the research and development stems from universities, companies are also interested in highly luminescent materials. However, most companies typically focus on oxides rather than halides. Oxides are currently the state-of-the-art material used in many luminescent material applications.

The current state-of-the-art phosphors such as Ce-doped YAG contain rare-earth elements (Ce in this case), which adds to the cost. More than 95% of rare-earth metals are mined and sold by China, so there is additional market unpredictability regarding rare-earth metals due to current trade and tariff issues between the United States and China. Additionally, current state-of-the-art oxide materials are generally prepared using high temperature synthesis methods, which results in added costs.

The materials and devices of the present disclosure are directed at overcoming the various problems and disadvantages described above.

DETAILED DESCRIPTION

Lead perovskites are attracting global interest for use in optoelectronic applications. However, the use of lead comes with several shortcomings. The present disclosure is directed to a new family of non-lead, thermally stable, and high-efficiency blue-emitting all-inorganic halides, including the Group 1A elements K, Rb, and Cs. In one non-limiting embodiment, for example, perovskites with the formula $Rb_2CuX_3$ (where X=Br, Cl, or I) exhibit a one-dimensional crystal structure featuring anionic $_\infty^1[CuX_3]^{2-}$ ribbons separated by $Rb^+$ cations. The measured, record high, photoluminescence quantum yield values range from 64% to 100% for $Rb_2CuCl_3$, which demonstrates an anti-Stokes photoluminescence (ASPL) signal for the first time for Pb-free metal halides. These highly-efficient narrow blue emitters based on a nontoxic and inexpensive metal copper can be used in low-cost and environmentally-friendly optoelectronic devices. Unlike lead-based halides, the materials discussed in this disclosure can be prepared at room-temperature with low toxicity elements, and have comparable or better light emission properties compared to current materials.

The present disclosure is therefore directed to Pb-free, low-dimensional halides which demonstrate increased charge localization and enhanced excitonic properties compared to those observed in lead halide perovskites. The result is efficient blue emitters that are free of toxic Pb. The present disclosure, in at least one non-limiting embodiment, demonstrates that through preparation of all-inorganic, thermally-stable $Rb_2CuX_3$ with near-unity PLQY blue emission is achievable. The remarkably high PLQY demonstrated by these compounds is attributed to the creation of self-trapped excitons (STEs) within a one-dimensional (1D) crystal structure.

Before describing various embodiments of the present disclosure in more detail by way of exemplary descriptions, examples, and results, it is to be understood as noted above that the present disclosure is not limited in application to the details of methods and apparatus as set forth in the following description. The present disclosure is capable of other embodiments or of being practiced or carried out in various ways. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the disclosure. However, it will be apparent to a person having ordinary skill in the art that the embodiments of the present disclosure may be practiced without these specific details. In other instances, features which are well known to persons of ordinary skill in the art have not been described in detail to avoid unnecessary complication of the description.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

All patents, published patent applications, and non-patent publications mentioned in the specification are indicative of the level of skill of those skilled in the art to which the present disclosure pertains. All patents, published patent applications, and non-patent publications referenced in any portion of this application are herein expressly incorporated by reference in their entirety to the same extent as if each individual patent or publication was specifically and individually indicated to be incorporated by reference.

As utilized in accordance with the methods and apparatus of the present disclosure, the following terms, unless otherwise indicated, shall be understood to have the following meanings:

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 15, 20, 30, 40, 50, 100, or any integer inclusive therein. The term "at least one" may extend up to 100 or 1000 or more, depending on the term to which it is attached; in addition, the quantities of 100/1000 are not to be considered limiting, as higher limits may also produce satisfactory results. In addition, the use of the term "at least one of X, Y, and Z" will be understood to include X alone, Y alone, and Z alone, as well as any combination of X, Y, and Z.

As used herein, all numerical values or ranges (e.g., in units of length such as micrometers or millimeters) include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, of 1-10, 10-20, 20-30, 30-40, 40-50, 50-60, 60-75, 75-100, 100-150, 150-200, 200-250, 250-300, 300-400, 400-500, 500-750, 750-1,000, includes ranges of 1-20, 10-50, 50-100, 100-500, and 500-1,000, for example.

As used herein, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

Throughout this application, the terms "about" or "approximately" are used to indicate that a value includes the inherent variation of error. Further, in this detailed description, each numerical value (e.g., temperature, thickness, time, mass, volume, concentration, etc.) should be read once as modified by the term "about" (unless already expressly so modified), and then read again as not so modified unless otherwise indicated in context. Unless otherwise stated, the term "about" or "approximately," where used herein when referring to a measurable value such as an amount, length, thickness, a temporal duration, and the like, is meant to encompass, for example, variations of ±20%, or ±10%, or ±5%, or ±1%, or ±0.1% from the specified value, as such variations are appropriate to perform the disclosed methods and as understood by persons having ordinary skill in the art.

As noted above, any numerical range listed or described herein is intended to include, implicitly or explicitly, any number or sub-range within the range, particularly all integers, including the end points, and is to be considered as having been so stated. For example, "a range from 1.0 to 10.0" is to be read as indicating each possible number, including integers and fractions, along the continuum between and including 1.0 and 10.0, that is, having a minimum value equal to or greater than 1.0 and a maximum value equal to or less than 10.0, such as, for example, 3.25 to 8.65. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. Thus, even if specific data points within the range, or even no data points within the range, are explicitly identified or specifically referred to, it is to be understood that any data points within the range are to be considered to have been specified, and that the inventors possessed knowledge of the entire range and the points within the range.

As used herein, the term "substantially" means that the subsequently described parameter, event, or circumstance completely occurs, or that the subsequently described parameter, event, or circumstance occurs to a great extent or degree. For example, the term "substantially" means that the subsequently described parameter, event, or circumstance occurs at least 90% of the time, or at least 91%, or at least 92%, or at least 93%, or at least 94%, or at least 95%, or at least 96%, or at least 97%, or at least 98%, or at least 99%, of the time, or means that the dimension or measurement is within at least 90%, or at least 91%, or at least 92%, or at least 93%, or at least 94%, or at least 95%, or at least 96%, or at least 97%, or at least 98%, or at least 99%, of the referenced dimension or measurement (e.g., thickness).

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment. Further, all references to one or more embodiments or examples are to be construed as non-limiting to the claims.

Where used herein, the term "optoelectronic device" refers to an electronic device that uses light. For example (but not by way of limitation), an optoelectronic device may be an electrical-to-optical or optical-to-electrical transducer, or an instrument that uses such a device or devices in its operation. Examples of optoelectronic devices include, but are not limited to, photovoltaic devices, photodiodes, phototransistors, photo-resistors, photo-detectors, light-sensitive detectors, solid-state triodes, light-emitting devices, light-emitting diodes, biosensors, temperature sensing devices, solar batteries, lasers, and diode injection lasers.

Where used herein, the term "thin layer" refers to a layer of a material, such as (but not limited to) a layer of a perovskite compound described herein, that has a thickness, for example, in a range of from about 10 nm to about 1000 nm or more, e.g. a range of from about 25 nm to about 100 nm.

Where used herein, the term "imaging agent" refers to a compound of material that can be used to visualize, by using naked human eye or using machine assisted viewing, cells, cell components, biological tissues, and/or organs, such as (but not limited to) cells, cell components, biological tissues, and/or organs of humans or other mammals, to which the imaging agent is bound or in which the imaging agent is taken up. The imaging agent may be combined with or conjugated to a carrier or targeting moiety.

In certain non-limiting embodiments, the carriers of the present disclosure may be "biodegradable polymers," that is, polymers or macromolecules which degrade or dissolve safely in a biological environment such as the human body. The polymers may be hydrophobic or hydrophilic, and/or crosslinked or non-crosslinked. The crosslinking may be done (for example, but not by way of limitation) via condensation polymerization, free radical polymerization, or ionic bonding. The biodegradable polymers may be random or block or graft copolymers. The biodegradable polymers may be linear, graft, dendrimer, or branched. Hydrophobic biodegradable polymers include, but are not limited to, polymers, dendrimers, copolymers or oligomers of glycolide, dl-lactide, d-lactide, l-lactide, caprolactone, dioxanone and trimethylene carbonate; degradable polyurethanes; polyamides; polyesters; polypeptides; polyhydroxyacids; polyorthocarbonates, polylactic acid; polyglycolic acid; polyanhydrides; and polylactones. Biodegradable polymers also include polyhydroxyalkanoates, which are polyesters produced by microorganisms including but not limited to poly(3-hydroxybutyrate), 3-hydroxyvalerate, 4-hydroxybutarate, 3-hydroxyhexanoate, and 3-hydroxyoctanoate. Hydrophilic polymers may include, but are not limited to, polyethylene glycol-polyhydroxy acid or polyethylene glycol-polylactone copolymers (PEG-PL copolymers); polyvinyl alcohol-co-polylactone copolymers; derivatives of cellulose; collagen or modified collagen derivatives; gelatin; albumin or crosslinked albumin; fibrinogen; keratin; starch; hyaluronic acid; and dextran. In certain non-limiting embodiments, the carriers of the present disclosure may be "biostable polymers" including, but not limited to, aliphatic and aromatic polyurethanes; polycarbonate polyurethane; polyether polyurethane; silicone polyurethane block copolymers; silicone rubbers; polydimethylsiloxane copolymers; polytetrafluoroethylene and other fluorinated polymers; expanded polytetrafluoroethylene; polyethylene; polypropylene; polyamide; polyamide block copolymers; polymethacrylates; polyacrylates; polymethyl methacrylate; polybutyl methacrylates; polyethylene vinylacetate; polyethylene vinylalcohol; polyethylene; polypropylene; and the like. The perovskite compounds of the present disclosure may be conjugated to the carrier or encapsulated by the polymer in a microparticle or microsphere. When intended for implantation in a human or animal body, the carrier should be biocompatible.

Use of the words "we" or "our" as pronouns herein refers generally to laboratory personnel or other contributors who assisted in the laboratory procedures and data collection and is not intended to represent an inventorship role by said laboratory personnel or other contributors in any subject matter disclosed herein.

Returning now to the non-limiting embodiments of the present disclosure, a series of highly luminescent, inexpensive, earth-abundant copper halide perovskites are described. The perovskites produce photoluminescence quantum yield values of about 100%. For the first time, the outstanding luminescence properties are demonstrated for several inexpensive, earth-abundant and easy-to-process copper halides, such as (but not limited to) the $Cs_3Cu_2Br_{5-x}I_x$ ($0 \leq x \leq 5$) family, $CsCu_2X_3$, and $Rb_2CuCl_3$, to name a few. These materials demonstrate near 100% (e.g., within about 95%, about 96%, about 97%, about 98%, or about 99%) photoluminescence quantum yield values, i.e., every or almost every, absorbed photon (light particle) is converted to an emitted photon. Such high conversion rates make these materials viable for use in sensing applications (e.g., in radiation detection), light-emitting diodes, security and anti-counterfeiting labels, and bio-labeling applications, and other devices recited herein. Additionally, these materials may be used as phosphors (i.e., light emitters) for LED bulbs and displays. In this disclosure the detailed structural and optical properties of these materials are evaluated, and the light emission mechanisms in these materials are determined. Additional embodiments include other specific uses of the luminescent materials including both solid form and powder form of those described in the present disclosure. In non-limiting embodiments these solid and powder form luminescent materials can be used for anti-counterfeiting labels and invisible ink applications for use in, for example (but not by way of limitation), paper currencies and other objects recited herein. In addition, the luminescent materials can be incorporated in optoelectronic devices for LED bulb and display applications. In certain non-limiting embodiments, the inorganic perovskite compounds disclosed or otherwise contemplated herein (and particularly, but not by way of limitation, the non-lead perovskite compounds of the disclosure) can be used as imaging agents, such as (but not limited to) medical imaging agents. Examples of other uses of the presently, disclosed perovskite compounds are shown elsewhere hereinbelow.

In certain non-limiting embodiments, the present disclosure is directed to a photoluminescent material comprising at least one inorganic perovskite compound. The inorganic perovskite compound comprises: (a) an alkali metal (X) selected from potassium (K), rubidium (Rb), and cesium (Cs); (b) copper (Cu); and (c) at least one halogen (X) selected from chlorine (Cl), bromine (Br), and iodine (I). The inorganic perovskite compound may have the formula $A_2CuX_3$, such as $Rb_2CuX_3$, wherein X is selected from Br, Cl, and I; or the formula $Rb_2CuBr_{3-y}I_y$, wherein $0 \leq y \leq 3$; or the formula $Cs_3Cu_2X_5$, wherein X is selected from Br, Cl, and I; or the formula $Cs_3Cu_2Br_{5-y}I_y$, wherein $0 \leq y \leq 5$; or the formula $K_2CuX_3$, wherein X is selected from Br, Cl, and I; or the formula $K_2CuBr_{3-y}I_y$, wherein $0 \leq y \leq 3$. The inorganic perovskite compound may be free of lead (Pb). The inorganic perovskite may have a form of a thin layer. The inorganic perovskite material may be an imaging agent. The imaging agent may comprise a carrier material on which or in which the inorganic perovskite material is disposed.

In at least certain non-limiting embodiments, the present disclosure is directed to an optoelectronic device comprising one or more of any of the inorganic perovskite compounds disclosed or otherwise contemplated herein. For example (but not by way of limitation), the optoelectronic device can include an inorganic perovskite compound comprising: (a)

an alkali metal (A) selected from potassium (K), rubidium (Rb), and cesium (Cs); (b) copper (Cu); and (c) at least one halogen (X) selected from chlorine (Cl), bromine (Br), and iodine (I). The inorganic perovskite compound of the optoelectronic device may have the formula $A_2CuX_3$, such as $Rb_2CuX_3$, wherein X is selected from Br, Cl, and I; or the formula $Rb_2CuBr_{3-y}I_y$, wherein 0≤3; or the formula $Cs_3Cu_2X_5$, wherein X is selected from Br, Cl, and I; or the formula $Cs_3Cu_2Br_{5-y}I_y$, wherein 0≤y≤5; or the formula $K_2CuX_3$, wherein X is selected from Br, Cl, and I; or the formula $K_2CuBr_{3-y}I_y$, wherein 0≤y≤3, The inorganic perovskite compound of the optoelectronic device may be free of lead (Pb). The inorganic perovskite of the optoelectronic device may have a form of a thin layer. The inorganic perovskite material of the optoelectronic device may comprise a carrier material, and the inorganic perovskite material is disposed on and/or in at least a portion of the carrier material.

The optoelectronic device may be any type of optoelectronic device known in the art or otherwise contemplated herein that is capable of functioning in accordance with the present disclosure Non-limiting examples of optoelectronic devices in accordance with the present disclosure include a photovoltaic device, a photodiode, a phototransistor, a a photo-resistor, a photo-detector, a light-sensitive detector, a solid-state triode, a light-emitting device, a light-emitting diode, a biosensor device, a temperature sensing device, a solar battery, a laser, or a diode injection laser. The optoelectronic device may comprise a phosphor, a transducer, and a single crystal layer comprising the inorganic perovskite compound, wherein optionally the inorganic perovskite compound is free of lead (Pb). The phosphor may be a blue-light emitter. When the optoelectronic device is a biosensor, it may have an emission intensity which is alterable relative to one or more biological factors, and wherein the inorganic perovskite compound is free of lead (Pb). When the optoelectronic device is a temperature sensing device, it may have an emission intensity which is alterable relative to temperature, and wherein the inorganic perovskite compound is free of lead (Pb).

In at least certain non-limiting embodiments, the present disclosure is directed to an object susceptible to counterfeiting, and the object comprises an anti-counterfeit nanotaggant which comprises luminescent copper-containing nanoparticles. The luminescent copper-containing nanoparticles comprise one or more of any of the inorganic perovskite compounds as described or otherwise contemplated herein. The anti-counterfeit nanotaggant is positioned on and/or within at least a portion of a surface of the object, and the luminescent copper-containing nanoparticles emit a predetermined emission wavelength when exposed to a predetermined excitation wavelength. The inorganic perovskite compound may be free of lead (Pb). The anti-counterfeit nanotaggant may be applied to the object in a predetermined pattern that is invisible until exposed to the excitation wavelength. The nanoparticles which comprise the inorganic perovskite compound may have dimensions in a range of from about 2 nm to about 2000 nm in non-limiting embodiments. The nanoparticles may be disposed in a carrier comprising an ink, a dye, or a resin. Non-limiting examples of such objects include paper currency, paper documents, personal checks, money orders, cashier's checks, credit cards, debit cards; driver's licenses, passports, identification cards, fabrics, leather materials, polymeric materials, wearing apparel, clothing labels, clothing tags, footwear; clothing accessories, belts, ties, hand bags, shoulder bags, wallets, earrings, watches, jewelry, consumer electronic devices, smartphones, laptop computers, printer cartridges, glass, plastic, or polymeric containers, golf balls, packaging materials, 3-dimensional objects, boxes, shipping containers, and building materials.

In at least certain non-limiting embodiments, the present disclosure is directed to a method of assessing authenticity of an object. The method comprises the steps of: (a) providing an object, wherein the object, when authentic, has an anti-counterfeit nanotaggant positioned on or within a surface of the object, the anti-counterfeit nanotaggant comprising luminescent copper-containing nanoparticles, wherein the nanoparticles comprise one or more of any of the inorganic perovskite compounds disclosed or otherwise contemplated herein; (b) exposing the object to an excitation wavelength which is effective in causing emission of a predetermined wavelength from the anti-counterfeit nanotaggant; and (c) classifying the object as authentic when the exposure of the object to the excitation wavelength causes emission of the predetermined wavelength from the object.

EXAMPLES

Examples are provided hereinbelow. However, the present disclosure is to be understood to not be limited in its application to the specific experimentation, results, and laboratory procedures disclosed herein after. Rather, the Examples are simply provided as one of various embodiments and are meant to be exemplary, not exhaustive.

Example 1—Rubidium-Based Copper Halides $Rb_2CuX_3$ (where X is selected from the group comprising bromine (Br), chlorine (Cl), and iodine (I)) crystallize in the orthorhombic space group Pnma featuring 1D $_\infty^1[CuX_3]^{2-}$ chains separated by Rb+ cations (see FIG. 1 in U.S. Ser. No. 62/910,699). The anionic of $_\infty^1[CuX_3]^{2-}$ chains are made of corner-sharing $[CuX_4]$ tetrahedra along the b-axis. $Rb_2CuX_3$ can be prepared both as polycrystalline powder samples or grown as single crystals (see FIG. 2 in U.S. Ser. No. 62/910,699) using solid-state synthesis and solvent evaporation techniques, respectively.

Methods, Results, and Discussion

Step 1. The starting reagents were used as received: (i) rubidium chloride (99%, Acros Organics, Morris Plains, N.J.), (ii) copper(I) chloride (>99%, Sigma-Aldrich, St. Louis, Mo.), (iii) rubidium bromide (99%, Alfa Aesar, Ward Hill, Mass.), (iv) copper(I) bromide (>99%, Alfa Aesar), (v) hydrochloric acid (37% wt, Sigma-Aldrich).

Step 2. Synthesis of $Rb_2CuX_3$

Step 2.1. $Rb_2CuBr_3$. A 2:1 stoichiometric amount of RbBr and CuBr were well ground under an inert atmosphere, pressed into a pellet, then sealed under vacuum. The pellet was annealed at 225° C. for 48 hours and slowly cooled to room temperature over 18 hrs. A second grinding and annealing was performed to ensure the homogeneity of the resulting product.

Step 2.2. $Rb_2CuCl_3$. Solid-state synthesis following the above described procedure for $Rb_2CuBr_3$ was used to obtain a polycrystalline powder sample of $Rb_2CuCl_3$. For single crystal growth, a 2:1 stoichiometric amount of RbCl and CuCl were separately dissolved in sparged concentrated HCl, under inert atmosphere. Then, the CuCl solution was added dropwise to the RbCl solution and heated at 95° C. for 3 hours followed by a slow cooling to room temperature. Colorless needle-like crystals of $Rb_2CuCl_3$ were formed overnight (see FIG. 2 in U.S. Ser. No. 62/910,699).

Step 3. Powder X-ray Diffraction (PXRD) Measurements. To check the phase identity and purity of $Rb_2CuX_3$ powder samples, PXRD was measured on a Rigaku Miniflex600 equipped with D/tex detector and a Ni-filtered Cu—Kα radiation source. Data was collected at room temperature in the 3-90° (2θ) range, with a step size of 0.02°. Using the Pawley refinement method, a proper match was confirmed between the measured and calculated PXRD patterns of $Rb_2CuX_3$ (X=Cl, Br), with the presence of a minor impurity peak at ~26° (see FIG. 3(b) in U.S. Ser. No. 62/910,699), which was determined to be less than 1% using Reference Intensity Ratio (RIR) analysis, and corresponds to the unreacted starting material RbBr, which is consistent with previous reports of $Rb_2CuBr_3$ preparation. The purity of single crystal samples of $Rb_2CuCl_3$ were investigated by comparing the PXRD patterns measured on single crystals with the calculated patterns based on single crystal XRD data (see FIG. 4 in in U.S. Ser. No. 62/910,699).

To test the air-stability of the crystal samples, the samples were left on a laboratory bench in ambient conditions, and periodic PXRD were performed. Lead chlorides and bromides are known to exhibit high air stability compared to lead iodides. Indeed, single crystals of $Rb_2CuCl_3$ did not exhibit any noticeable degradation when left in ambient air (see FIG. 5 in U.S. Ser. No. 62/910,699). However, polycrystalline powder of $Rb_2CuCl_3$ kept in ambient air shows noticeable signs of degradation after one day with decomposition products including $Rb_2CuCl_4.2H_2O$ and RbCl (see FIG. 6 in U.S. Ser. No. 62/910,699). The formation of the hydrate product $Rb_2CuCl_4.2H_2O$ is indicative of the fact that the material's stability greatly depends on the humidity of the environment. The oxidation of Cu results in a visual change of powder color from white to light green (see FIG. 5, Panels (a)-(b) in U.S. Ser. No. 62/910,699). In contrast, $Rb_2CuBr_3$ shows a markedly better air stability with no significant changes up to one week in air; however, prolonged exposure over a period of two months led to the emergence of RbBr as the major phase (see FIG. 7 in U.S. Ser. No. 62/910,699). It has been previously reported that CuBr is more stable than CuCl in ambient atmosphere, which is consistent with our observation of better air stability of $Rb_2CuBr_3$ compared to $Rb_2CuCl_3$.

Step 4. Thermogravimetric Analysis and Differential Scanning calorimetry (TGA/DSC) Measurements. Simultaneous thermogravimetric analysis and differential scanning calorimetry (TGA/DSC) were measured on ~10 mg of polycrystalline powder of $Rb_2CuX_3$ on an SDT 650 thermal analyzer system (TA Instruments, New Castle, Del.). Samples were heated from 25° C. to 475° C. under an inert flow of dry nitrogen gas at a rate of 100 mL/min, with a heating rate of 5° C./min.

The thermal stability of an emitter material is an important parameter for luminescent materials integrated into optoelectronic devices, such as (but not limited to) down conversion phosphors for optically pumped white LEDs, because the devices' operation temperature often exceed 70° C. under continuous operation. Unlike most hybrid organic-inorganic lead halide perovskites, $Rb_2CuX_3$ show no significant weight loss up to 475° C. (see FIG. 8 in U.S. Ser. No. 62/910,699), which is in agreement with reports on similar all-inorganic metal halides such as $Cs_3Cu_2Br_5{-}_xI_x$ and $Rb_4Ag_2BiBr_9$. Moreover, DSC data shows that $Rb_2CuCl_3$ and $Rb_2CuBr_3$ are thermally stable up to 274° C. and 271° C., respectively, at which temperature they undergo peritectic decompositions, which is in excellent agreement with the reported phase diagrams. The thermal properties of $Rb_2CuX_3$ are similar to those reported in several metal halide all inorganic compounds such as $Cs_2SnI_6$.

Step 5. Optical Measurements. Room temperature photoluminescence (PL) and photoluminescence excitation (PLE) measurements were performed on polycrystalline powders of $Rb_2CuX_3$ and single crystals of $Rb_2CuCl_3$ on a Jobin Yvon Fluorolog-3 spectrofluorometer (HORIBA Instruments, Inc., Irvine, Calif.) equipped with a xenon lamp and Quanta-φ integrating sphere using the two-curve method in a varied range from 280 nm to 860 nm.

Additional confirmatory PLQY measurements were performed on single crystals of $Rb_2CuCl_3$ using a Jobin Horiba FluoroMax4 equipped with a 150 W Xenon lamp and an R928 PMT detector. The Quanta-φ integrating sphere (15 cm) with a polytetrafluoroethylene (PTFE) cup as the sample holder and a PTFE stub as the blank was used for the four-curve analysis. Typical methods used a 0.1 second integration time (0.5 nm increment) for the absorbance region and 0.1 second integration time (1 nm increment) for the luminescence region with a 3 nm bandpass on excitation and emission slits for both. When necessary, optical filters were used to attenuate the signal to appropriate levels and to reduce scattering. Radiometric (red), sphere, and dark count corrections were applied during data acquisition, while corrections for neutral density and long pass filters and integration time differences were applied in the final calculation of PLQY in the FluorEssence™ analysis package for Quantum Yield (FluorEssence v3.8.0.60, Origin v8.6001).

Quantum yield was then calculated according to Equation (1) below:

$$\text{Quantum Yield} = \left(\frac{Em_s - Em_b}{Ex_b - Ex_s}\right) * 100 \qquad (1)$$

where $Ex_s$ and $Ex_b$ are the integrated excitation profiles of the sample and the blank, and $Em_s$ and $Em_b$ are the integrated emission profiles of the sample and blank, respectively. An Area Balance Factor is applied in the FluorEssence software which accounts for changes in integration times between excitation and emission scans and for the use of neutral density filters.

For $Rb_2CuCl_3$, the results indicated a net phonon-assisted anti-Stokes photoluminescence (ASPL), and an optical cooling efficiency of ~32% at room temperature. The optical cooling by ASPL (also known as upconversion PL) was previously reported in several rare earth-based materials, semiconductors such as CdS, and more recently in a few hybrid organic-inorganic and all-inorganic perovskite-type materials. This process takes place as a result of a light excitation energy below the band gap of the material producing a non-equilibrium electron distribution. Then, the exciting photon first interacts with the lattice, leading to phonon absorption followed by blue-shifted luminescence. This mechanism leads to the extraction of the heat energy from the lattice by emitting a higher energy photon, which cools down the material. The advantages of metal halides is the high PLQY and the relatively low trap-states density, which are important parameters for optical cooling. For example, exceptionally strong ASPL and a remarkable optical cooling of 58.7 K was observed in the exfoliated crystals of two-dimensional (2D) layered perovskite $(C_6H_5C_2H_4NH_3)_2PbI_4$.

Optical absorption spectra of polycrystalline powder samples of $Rb_2CuX_3$ show two features at ~260 and ~300 nm due to electronic transition from the top of the valence band (VB) to the bottom of the conduction band (CB) made of [CuX$_3$] states. Upon UV irradiation, the room temperature PL spectra of polycrystalline powders of Rb$_2$CuX$_3$ show a very bright blue emission (see FIG. 9 in U.S. Ser. No. 62/910,699). The PL maxima are located at ~385 and 395 nm, with full width at half maximum (FWHM) values of 54 and 52 nm and relatively small Stokes shifts of 85 and 93 nm for Rb$_2$CuBr$_3$ and Rb$_2$CuCl$_3$, respectively. Most of the low-dimensional (1D and 0D) metal halides materials emit strongly Stokes shifted spectra due to significant structural distortions in excited states. In contrast, the PL results on Rb$_2$CuX$_3$ are notably different for several reasons. First, Rb$_2$CuX$_3$ are among the few blue emitters with a near UV excitation and small Stokes shift blue emission, which is advantageous given the small energy loss between PLE and PL. Secondly, the measured PL linewidths of 54 nm and 52 nm for Rb$_2$CuBr$_3$ and Rb$_2$CuCl$_3$, respectively, are among the lowest for highly-efficient blue emitting bulk samples. Note that obtaining materials that combine efficient blue emission with narrow emission linewidth is a recognized challenge, and the best literature-reported narrow blue emitters are (C$_6$H$_5$CH$_2$NH$_3$)$_2$PbBr$_4$ nanoplates and CsPbX$_3$ quantum dots, which unlike our bulk samples are obtained through nanostructuring. Finally, the visibly bright blue emission was corroborated by the high PLQY values of 64% and 85% measured on polycrystalline powders of Rb$_2$CuBr$_3$ and Rb$_2$CuCl$_3$, respectively (see FIG. 10, Panels (a)-(b) in U.S. Ser. No. 62/910,699). Note that PLE spectra measured on polycrystalline Rb$_2$CuX$_3$ for emission wavelengths of 386 and 400 nm show maxima at 295 and 300 nm, accompanied with a shoulder at 260 nm for Rb$_2$CuBr$_3$ and Rb$_2$CuCl$_3$, respectively, which coincides with the measured absorption spectra (see FIG. 9 in U.S. Ser. No. 62/910,699). Furthermore, measured room temperature PL/PLE on single crystals of Rb$_2$CuCl$_3$ was also measured, which matches the PL/PLE of the bulk powder sample (see FIG. 11 in U.S. Ser. No. 62/910,699). Importantly, a unity (~100%) PLQY value was measured on single crystals of Rb$_2$CuCl$_3$ (see FIG. 10, Panel (c) in U.S. Ser. No. 62/910,699), which is the record high for known blue emitters. The difference in the measured PLQY values with respect to the nature of sample (i.e., PLQY of 85% for a powder sample vs 100% for single crystals) is mainly due to the fact that single crystals contain less surface defects than polycrystalline powders and thin films. This is also consistent with the literature results on other copper halides including PLQY values of 60% and 90% reported for thin films and single crystals of Cs$_3$Cu$_2$I$_5$, respectively.

To understand the photophysical origin of the highly efficient blue-emission of Rb$_2$CuX$_3$, its excitation and power dependence PL spectra were measured at ambient temperature (see FIGS. 12-13 in U.S. Ser. No. 62/910,699). Results show that Rb$_2$CuX$_3$ compounds have excitation-dependent emission shapes and a linear dependence of the PL intensity as a function of excitation power. This fact demonstrates the intrinsic nature of Rb$_2$CuX$_3$ blue emission, and the absence of saturation at high excitation power excludes the presence of permanent defects emissions. Therefore, this intense and fairly broad blue-emission is attributed to STEs often observed in metal halide all-inorganic systems. On the other hand, it has been previously reported that the γ-CuX (X=Br, Cl, I) have significant light emission properties in the 300-400 nm spectral range, suitable for novel UV/blue light applications. Here, the room temperature emission spectra of the starting reactant γ-CuX was also measured (see FIG. 14 in U.S. Ser. No. 62/910,699), that show a UV-blue light emission with the presence of two PL peaks at 384 and 395 nm for γ-CuCl and at 422 and 433 nm for γ-CuBr, in excellent agreement with previous reports. However, the measured PLQY values of γ-CuX were very low (<0.5%). The remarkable enhancement of emission efficiency of the ternary halides Rb$_2$CuX$_3$ compared to the binary parents CuX is mainly due to the quantum confinement effect resulting from the reduction of structural dimensionality from three-dimensional (3D) corner-sharing tetrahedra for γ-CuX (the zinc blended structure) to 1D for Rb$_2$CuX$_3$, a well-known effect that results in higher exciton binding energies and improved exciton stabilities.

To further investigate the main origin of the ultrabright blue emission of Rb$_2$CuCl$_3$, density functional theory (DFT) calculations were carried out.

Computational Methods

Calculations were based on DFT as implemented in the VASP code. The kinetic energy cutoff of the plane-wave basis is 369 eV. The projector augmented wave method was used to describe the interaction between ions and electrons. The unit cell contains four formula units of Rb$_2$CuCl$_3$. The lattice parameters were fixed at the experimentally measured values (a=12.501 Å, b=4.272 Å, c=13.0 Å, α=β=γ=90°), while the atomic positions were optimized until the force on each atom was less than 0.02 eV/Å. A 1×5×1 supercell was used to model localized excitons in Rb$_2$CuCl$_3$. A single Γ point was used for Brillouin zone integration. The convergence test shows that doubling the k-point mesh density in the directions perpendicular to the 1D chain direction (axis b) resulted in a small change in the total energy (0.4 meV/atom), indicating negligible inter-chain coupling.

The electronic band gap of Rb$_2$CuCl$_3$ was calculated using Perdew-Burke-Ernzerhof (PBE) exchange-correlation functional as well as the hybrid PBE0 functional, which has 25% non-local Fock exchange. Excitonic properties were studied using the PBE0 functional (The inclusion of a fraction of Fock exchange significantly improves the band gap energy and the description of charge localization in insulators. Previous PBE0 calculations have provided critical understanding of the structural and electronic properties of self-trapped and dopant-bound excitons in halides.). The total energy of an exciton was calculated by fixing the occupation numbers of the electron and hole-occupied eigenlevels [Δ self-consistent field (ΔSCF) method]. The ΔSCF method can be easily used in Rb$_2$CuCl$_3$, because the electron and hole are both highly localized, and each occupies one single eigenlevel deep inside the band gap. The ΔSCF method combined with the hybrid PBE0 functional allows excited-state structural relaxation and has shown accurate results in exciton excitation and emission energies in many compounds. Following the Franck-Condon principle, the optical excitation and emission energies were obtained by calculating the total energy differences between the excited and the ground states using PBE0-optimized ground-state and excited-state structures, respectively.

According to the Materials Project, the band gap of Rb$_2$CuCl$_3$ was shown to be slightly indirect. The calculated direct band gap at the Γ point is 1.99 eV (at the PBE level), which is likely due to the well-known band gap error in the PBE calculation, but is consistent with the previous PBE calculation. The PBE0 calculation increases the band gap at the Γ point to 4.51 eV. An analysis of the wavefunction character shows that the valence (conduction) band is primarily derived from the antibonding orbitals of Cu-3d (Cu-4s) and Cl-3p. The promotion of an electron from the VB to the CB creates a highly localized exciton even without structural relaxation. The excitation energy calculated based on the undistorted ground-state structure is 3.85 eV, close to the experimentally measured peak excitation energy (4.13 eV or 300 nm). The excited-state structural relaxation leads to strong local structural distortion, further lowering the total energy. The resulting localized STE is shown in FIG. 15 in U.S. Ser. No. 62/910,699. The exciton self-localization around a Cu ion on the 1D Cu—Cl chain significantly weakens two Cu—Cl bonds [Cu(1)-Cl(1) and Cu(1)-Cl(2) in FIG. 15 in U.S. Ser. No. 62/910,699]. The calculated Cu(1)-Cl(1) and Cu(1)-Cl(2) bond lengths were 2.85 Å and 2.61 Å, which are 16.3% and 6.5% longer, respectively, than the Cu—Cl bond length of 2.45 Å at the ground state. The calculated exciton emission energy based on the relaxed STE structure was 2.88 eV, close to the experimentally measured peak emission energy (3.14 eV or 395 nm). The good agreement between the calculated and measured exciton excitation/emission energies validates the excited-state theoretical modeling and supports the predicted exciton self-trapping, as shown in FIG. 15 in U.S. Ser. No. 62/910,699.

For $Rb_2CuCl_3$, the unity PLQY blue emission and noticeable overlap between the absorption and emission spectra (see FIG. 9 in U.S. Ser. No. 62/910,699) demonstrate a possible optical cooling due to PL upconversion. As shown in FIG. 9 in U.S. Ser. No. 62/910,699, the optical absorption spectra of $Rb_2CuX_3$ show a long band tail that quenches only at a very low energy (~1.9 eV), demonstrating a high probability to have phonon-assisted ASPL above the 1.9 eV (650 nm) energy. The ASPL spectra was measured of the highly emissive single crystals of $Rb_2CuCl_3$ using different excitation wavelengths in the 490-650 nm range (see FIG. 16 in U.S. Ser. No. 62/910,699). Results show the presence of upconversion PL with the maximum emission observed under 520 nm excitation. Note that the other mechanisms of ASPL include defect/impurity effects and two-photon absorption. However, since the lowest excitation peak was observed at 300 nm, the two-photon absorption mechanism would necessitate $PLE_{max}$ of 600 nm for ASPL instead of the observed 520 nm. The defect effects were largely ruled out based on the observed unity PLQY for the $Rb_2CuCl_3$ single crystals, which have also been shown to be free of impurities using the X-ray methods.

According to the previous studies based on Sheik-Bahae theory, the optical cooling efficiency can be estimated from the following Equation (2):

$$\eta\_C = \eta\_PLE\_em/E\_ex - 1 \quad (2)$$

where $\eta_C$ and $\eta_{PL}$ are the cooling and PL efficiency, respectively, and $E_{em}$ and $E_{ex}$ present the emission and excitation energies, respectively. Considering that single crystals of $Rb_2CuCl_3$ show a 100% PLQY, and the maximum ASPL occurs at 395 nm (3.14 eV) under 520 nm (2.385 eV), using the above Equation (2), an optical cooling efficiency of ~32% is estimated. This value is similar to the highest values recently reported for hybrid perovskite and all inorganic metal halides. Further detailed spectroscopic investigations including Raman spectroscopy is in progress to better understand the physical origin of the observed ASPL of $Rb_2CuCl_3$.

In summary, photophysical properties of bulk and single crystal samples of all-inorganic metal halide materials $Rb_2CuX_3$, which exhibit one-dimensional crystal structures featuring anionic $_\infty^1[CuX_3]^{2-}$ ribbons separated by $Rb^+$ cations are disclosed. These materials simultaneously show remarkably high blue emission efficiency and narrow emission linewidths: PLQY values of 64% to 100% and FWHM values of 54 and 52 nm for $Rb_2CuBr_3$ and $Rb_2CuCl_3$, respectively, are among the record values in each category for bulk samples. Furthermore, the measured Stokes shifts of 85 and 93 nm for $Rb_2CuBr_3$ and $Rb_2CuCl_3$, respectively, are unusually small for low-dimensional multinary halide, and can be advantageous for practical applications, given the comparatively low energy loss between emission and excitation. Based on excitation- and power-dependent PL studies, the physical origin of the emission is attributed to STEs, which is further supported by DFT calculations demonstrating the presence of enhanced excitonic interactions. Moreover, $Rb_2CuCl_3$ shows an ASPL can provide up to 32% optical cooling efficiency, shown for the first time herein for Pb-free metal halides. Importantly, discoveries of highly-efficient blue emitters based on nontoxic and inexpensive copper allows for the development of low-cost and environmentally-friendly copper halides for optoelectronic devices.

Example 2—Cesium-Based Copper Halides

The optical properties of nontoxic and highly emissive 1D all-inorganic halides $CsCu_2X_3$ (X=Cl, Br, or I) and their mixed halide derivatives, show improved thermal and air stability over lead-based halides. PL measurements show a tunable bright room temperature emission from green to yellow with photoluminescence quantum yields ranging from 0.38% ($CsCu_2Br_{1.5}I_{1.5}$) to 48.0% ($CsCu_2Cl_3$). Temperature and power-dependent PL measurements indicate the emission results from self-trapped excitons induced by strong charge localization and structural distortions within the 1D ribbon structure.

The presence of room temperature (RT) stable excitons in low-dimensional halide systems has proven advantageous for enhanced RT luminescence properties observed for a number of materials including the green-emitting $Cs_4PbBr_6$, $CsCuBr_2$, and $Cs_2CuCl_4$, which show a largely Stokes-shifted broad-band green emission from copper defects, and the blue-emitting $Cs_3Cu_2Br_{5-x}I_x$, which all exhibit low-dimensional (0D-2D) crystal structures. Therefore, the emission properties of such halides can be used in LED applications.

Methods, Results, and Discussion

The presently disclosed earth-abundant and non-toxic $CsCu_2X_3$ family exhibits high efficiency light emission properties with PLQY values up to 48%. $CsCu_2X_3$ crystallize in the orthorhombic space group Cmcm in a 1D ribbon-like crystal structure (see FIG. 17 in U.S. Ser. No. 62/910, 699), featuring edge-sharing $[Cu_2X_3]^-$ anionic ribbons separated by rows of $Cs^+$ atoms. The high PLQYs of $CsCu_2X_3$ are thus attributed to the 1D chain structure in this family. Purity of all samples was assessed with PXRD measurements (see FIGS. 18-19 in U.S. Ser. No. 62/910, 699), confirming that the crystallographic parameters increase linearly as the size of the halide increases following Vegard's law (see FIG. 20 in U.S. Ser. No. 62/910,699, and Tables 1-2 below).

Step 1. Reactants

Chemicals utilized in this Example were used as purchased: (i) copper (I) chloride, 99.99%, Acros Organics (Morris Plains, N.J.); (ii) copper(I) bromide, 99.999%, Sigma-Aldrich (St. Louis, Mo.); (iii) copper iodide, 99.9%, Sigma-Aldrich; (iv) cesium chloride, 99.99%, Acros Organics; (v) cesium bromide, 99.9%, Acros Organics; (vi) cesium iodide, 99.999%, Acros Organics.

Step 2. Synthesis of $CsCu_2X_3$

Crystalline ingots were prepared using a 1:2 stoichiometric ratio of CsX to CuX ground in an agate mortar, pelletized, and sealed under dynamic vacuum in quartz ampules.

Pelletized samples were annealed at 410° C. for 48 hours and slowly cooled over 20 hours to room temperature, resulting in polycrystalline ingot.

Step 3. Powder X-Ray Diffraction.

PXRD measurements were performed on a Rigaku Mini-Flex600 system (Wilmington, Mass.) equipped with a Dtex detector using a Ni-filtered Cu-Kα radiation source. All scans were performed at room temperature from the 5-90° (2θ) range, with a step size of 0.2°. All data were corrected for the amorphous background of the glass slides used during collection and fitted using the Pawley method through Rigaku's PDXL2 software package. To check the air stability, samples were left in ambient air for more than two months with periodic PXRD measurements using the same condition mentioned above.

TABLE 1

Summary of Lattice Constants from Pawley fits of the PXRD Data for $CsCu_2X_3$

| Composition | A (Å) | b (Å) | c (Å) | V (Å$^3$) |
|---|---|---|---|---|
| $CsCu_2Cl_3$ | 9.4925(2) | 11.8780(2) | 5.5935(2) | 630.67(2) |
| $CsCu_2Cl_{1.5}Br_{1.5}$ | 9.5541(9) | 12.2059(11) | 5.7218(5) | 667.27(11) |
| $CsCu_2Br_3$ | 9.866(2) | 12.348(7) | 5.816(5) | 708.6(5) |
| $CsCu_2Br_{1.5}I_{1.5}$ | 9.9424(7) | 12.9562(9) | 5.9935(4) | 772.06(9) |
| $CsCu_2I_3$ | 10.545(2) | 13.173(9) | 6.099(9) | 847.4(1) |

TABLE 2

Selected Interatomic Distances (Å) and Angles (°) in $CsCu_2X_3$ Based on the Crystallographic Data Reported in Literature

| Label | | Distance (Å) | Label | Angle (°) |
|---|---|---|---|---|
| $CsCu_2Cl_3$ | | | | |
| Cu- | Cl1 | 2.490(1) | Cl1-Cu-Cl2 | 119.30(9) |
| | Cl2 | 2.272(8) | Cl1-Cu-Cl3 | 107.33(5) |
| | Cl3 | 2.273(0) | Cl1-Cu-Cl4 | 109.49(2) |
| | Cl4 | 2.490(4) | Cl2-Cu-Cl3 | 109.49(2) |
| | | | Cl3-Cu-Cl4 | 102.44(9) |
| | | | Cl2-Cu-Cl4 | 119.30(9) |
| $CsCu_2Br_3$ | | | | |
| Cu- | Br1 | 2.570(8) | Br1-Cu-Br2 | 106.41(4) |
| | Br2 | 2.427(0) | Br1-Cu-Br3 | 108.15(5) |
| | Br3 | 2.427(0) | Br1-Cu-Br4 | 108.61(0) |
| | Br4 | 2.571(4) | Br2-Cu-Br3 | 108.61(0) |
| | | | Br3-Cu-Br4 | 116.48(2) |
| | | | Br2-Cu-Br4 | 106.41(4) |
| $CsCu_2I_3$ | | | | |
| Cu- | I1 | 2.703(4) | I1-Cu-I2 | 109.80(1) |
| | I2 | 2.604(2) | I1-Cu-I3 | 107.10(2) |
| | I3 | 2.604(2) | I1-Cu-I4 | 108.91(0) |
| | I4 | 2.703(0) | I2-Cu-I3 | 114.24(4) |
| | | | I3-Cu-I4 | 114.24(4) |
| | | | I2-Cu-I4 | 109.80(1) |

Step 4. Thermal Analysis

Simultaneous thermogravimetric analysis (TGA) and differential scanning calorimetry (DSC) measurements were carried out on an SDT650 unit (TA Instruments, New Castle, Del.). Measurements were performed using 90 μL alumina crucibles on 8-10 mg samples under a 100 mL/min flow of dry nitrogen in the 100-575° C. range with 5° C./min heating rate.

Step 5. Optical Measurements

Room temperature diffuse reflectance spectra of polycrystalline powder of $CsCu_2X_3$ of were measured using a high-resolution PerkinElmer LAMBDA 750 UV-vis-NIR spectrometer (Waltham, Mass.) equipped with a 100 mm InGaAs integrating sphere attachment. The diffuse reflectance data were converted to pseudoabsorption spectra according to the Kubelka-Munk equation: $(F(R)=\alpha/S=(1-R)^2/(2R)$, where R is the reflectance, α is the absorption coefficient, S is the scattering coefficient.

PLE and PLQY measurements were performed at ambient temperature, on polycrystalline powder samples, using a Jobin Yvon Fluorolog-3 spectrofluorometer (HORIBA Instruments, Inc., Irvine, Calif.) equipped with a Xenon lamp and Quanta-φ integrating sphere. PLQY data were analyzed using the two-curve method in a varied range from 280-800 nm using the imbedded QY software in the Horiba-Jobin Yvon software.

Time resolved photoluminescence (TRPL) measurements were done on polycrystalline powder samples using a HORIBA Jobin Yvon Fluorolog-3 spectrofluorometer equipped with a time-correlated single photon counting module. HORIBA Jobin Yvon NanoLEDs (pulsed light-emitting diodes) were used as the excitation source. The duration of the light pulse was shorter than 2 ns. Temperature and power dependence PL spectra were measured using a PIXIS-eXcelon silicon CCD (Princeton Instruments, Trenton, N.J.). The excitation wavelength was the 325 nm (3.815 eV) line of a He—Cd laser (Kimmon Electric HeCd dual-wavelength laser; model: IK552R-F, Centennial, Colo.). The samples were placed in a helium bath cryostat, and the measurements were performed between 4 and 295 K.

In-Depth Structural Analysis

Isolation of the copper halide tetrahedra as ribbons can be seen most prominently down the b and c axis (see FIG. 17, Panels (b)-(c) in U.S. Ser. No. 62/910,699), where the Cs$^+$ cations fill in the channels separating [Cu$_2$X$_3$]$^-$ "nanowires," which greatly impacts the observed luminescence in this family. The Cu—X bond distances in the [Cu$_2$X$_3$]$^-$ chains vary from 2.272 to 2.490 Å for $CsCu_2Cl_3$, 2.427 to 2.571 Å for $CsCu_2Br_3$, and 2.604 to 2.703 Å for $CsCu_2I_3$, following the expected trend based on the increasing halide ionic radii going down the group. Noticeable distortions of the CuX$_4$ tetrahedra were evident from the tetrahedral angles (X—Cu—X) of 102.45 to 119.31°, 106.41 to 116.48°, and 107.1 to 114.24° for X=Cl, Br, and I, respectively. Interestingly, a trend of decreasing tetrahedral distortions going down the group was observed in this series.

In octahedral systems, connectivity and magnitude of distortion are known to affect the band structure, emission properties, and defect formation within a perovskite lattice and are evaluated using the bond lengths and angles between the metals and halides and the volume of the individual octahedra. Deviation from ideal octahedral geometry results in an increase in distortion within a perovskite system and has been shown to negatively affect the overlap between the orbitals of the metal and halides resulting in wider band gaps and blue shifting the onset of absorption, as well as decreasing the PLQY and lifetime due to an increase in the reduced mass of excitons within the system. Among the quantitative methods used to determine the magnitude of distortion within a perovskite system, the variation in octahedral distance (Δd), angle ($\sigma^2_{oct}$), and the overall octahedral elongation ($<\lambda_{oct}>$) have been used in particular to relate increase in distortion with increased Stokes-shifts, FWHMs, and broad white-light emission caused by the self-trapping of carriers resulting from strong exciton-phonon coupling. Such broadband luminescence is commonly seen in alkali halides, hybrid organic-inorganic materials, and recently in all-inorganic metal halides such as $A_3M_2I_9$ (A=Cs, Rb;

M=Bi, Sb), CsZnCl$_2$I, (C$_8$NH$_{12}$)$_4$Bi$_{0.57}$Sb$_{0.43}$Br$_7$, and Cs$_2$AgInCl$_6$. The optical properties of the CsCu$_2$X$_3$ systems with that of other octahedral systems were related to the calculated tetrahedral distortion to the optical properties reported below. The effect of tetrahedral distortion on optoelectronic properties in solid-state structures have been rarely studied, with no reports comparing the magnitude of distortion to the observed properties, like in many octahedral systems. The quantitative tetrahedral distortion parameters directly correlated to the proposed octahedral parameters $\sigma^2_{oct}$ and $\lambda_{oct}$, allowing for the comparison of the amount of distortion present in completely different polyhedra-based systems. Using this method, the $\sigma^2_{tet}$ and $\langle\lambda_{tet}\rangle$ values were calculated for CsCu$_2$X$_3$ and found that the distortion from both $\sigma^2_{tet}$ and $\langle\lambda_{tet}\rangle$ decreased from CsCu$_2$Cl$_3$ to CsCu$_2$I$_3$. Typically four parameters, variation in angle ($\sigma^2$, $\Delta\theta_{XMX}$) and bond distance ($\langle\lambda\rangle$, $\Delta d$) have been used to quantify octahedral distortion through the differences in bond distances and angles, respectively. In an attempt to relate the observed luminescence of CsCu$_2$X$_3$ to the structural distortions observed in these compounds, similar distortion analysis adopted for the tetrahedral geometry was performed. The tetrahedral angle variance ($\sigma^2_{tet}$) and the average tetrahedral elongation $\langle\lambda_{tet}\rangle$ are given by Equations (3) and (4):

$$\sigma^2_{\theta(tet)} = \frac{1}{5}\sum_{i=1}^{5}(\theta_i - 109.47°)^2 \quad (3)$$

$$\langle\lambda_{tet}\rangle = \frac{1}{4}\sum_{i=1}^{4}\left(\frac{l_i}{l_0}\right)^2 \quad (4)$$

where $\sigma^2_{tet}$ is deviation in bond angle of the system, $\theta_{tet}$ is the individual tetrahedral angles between the center metal and each adjacent ligand, $\langle\lambda_{tet}\rangle$ is the overall octahedral elongation, $l_i$ is the measured distance between the metal center and each ligand, and $l_0$ is the ideal bond distance determined from the ionic radii.

Octahedral $\Delta d$ and $\Delta\theta_{XMX}$ relationships can be adapted for tetrahedral systems via Equations (5) and (6):

$$\Delta d = \frac{1}{4}\Sigma_{n=1,4}\left(\frac{d_n - d}{d}\right)^2 \quad (5)$$

$$\Delta\theta_{XMX} = \frac{1}{6}\Sigma_{n=1,6}\left(\frac{\theta_{XMX(n)} - \langle\theta\rangle}{\langle\theta\rangle}\right)^2 \quad (6)$$

where $\Delta d$ is one fourth of the summation of each difference of each individual bond distance ($d_n$) and the average bond distance (d) of the tetrahedra in question squared, and $\Delta\theta_{XMX}$ is one sixth of the summation of the absolute value of the difference of each individual angle ($\theta_{XMX(n)}$) and the average angle of the tetrahedra in question $\langle\theta\rangle$ squared. The results of these analyses are summarized in Table 2. Confirming the noticeable trend observed for bond angles, $\sigma^2_{tet}$, $\langle\lambda_{tet}\rangle$, $\Delta d$, and $\Delta\theta_{XMX}$ demonstrate decreasing tetrahedral distortion from CsCu$_2$Cl$_3$ to CsCu$_2$Br$_3$ to CsCu$_2$I$_3$. For CsCu$_2$X$_3$, as shown in Table 3, the Stokes-shift increased from 208 to 249 nm, and the FWHM of the broadband emission increased from 102 and 200 nm, going from CsCu$_2$Cl$_3$ to CsCu$_2$I$_3$, which is typically due to increasing distortion within octahedral systems.

TABLE 3

Photoluminescence Information Table for all Members

| Compound | PLQY (%) | FWHM (nm) | PLE (nm) | PL (nm) | CIE coordinates | CCT (K) | Stokes-shift (nm) | Lifetime (ns) |
|---|---|---|---|---|---|---|---|---|
| CsCu$_2$Cl$_3$ | 48.0 | 102 | 319 | 527 | (0.29, 0.52) | 6437 | 208 | 13.8 |
| CsCu$_2$Cl$_{1.5}$Br$_{1.5}$ | 0.37 | 200 | 340 | 587 | (0.089, 0.52) | 12577 | 247 | 15.1 |
| CsCu$_2$Br$_3$ | 18.3 | 106 | 319 | 533 | (0.27, 0.53) | 6872 | 214 | 18 |
| CsCu$_2$Br$_{1.5}$I$_{1.5}$ | 0.38 | 128 | 335 | 584 | (0.48, 0.51) | 3094 | 249 | 26.6 |
| CsCu$_2$I$_3$ | 3.23 | 126 | 334 | 576 | (0.43, 0.47) | 3561 | 242 | 62 |

Device Fabrication

LED fabrication was attempted based on CsCu$_2$X$_3$ (see FIG. 21 in U.S. Ser. No. 62/910,699). In order to fabricate LEDs, a CsCu$_2$I$_3$ was used as a yellow additive in a 1,3-Bis(N-carbazolyl)benzene (mCP) host layer. LEDs were fabricated on patterned indium tin oxide (ITO) glass substrates. An ITO was used as a transparent bottom anode. The substrates were first cleaned with acetone and isopropanol in an ultrasonic cleaner and subsequently rinsed with deionized water, blown dry with N$_2$ gas, and treated with UV ozone. A MoO$_3$ and a 4,4'-Cyclohexylidenebis[N,N-bis(4-methylphenyl)benzenamine] (TAPC) were used as a hole injection layer and a hole transport layer, respectively. CsCu$_2$I$_3$ (10 vol. %) doped in mCP host was used as a yellow emission layer. A 1,3,5-tri(m-pyrid-3-yl-phenyl)-benzene (TmTyPB) and a LiF were used as an electron transport layer and an electron injection layer, respectively. An Al was used as a top reflective cathode. All layers were deposited sequentially by vacuum thermal evaporation at a pressure of 10$^{-6}$ Torr. The area of the device was 4 mm$^2$.

Computational Methods

DFT calculations were performed using the VASP code. The interaction between ions and electrons was described by the projector augmented wave method. The valence wavefunctions were expanded in a plane-wave basis with a cut-off energy of 369 eV. All atoms were relaxed to minimize the Feynman-Hellmann forces to below 0.02 eV/Å. The electronic band structure and the density of states were calculated based on Perdew-Burke-Ernzerhof (PBE) exchange-correlation functional. The band gap was further corrected by the hybrid PBE0 functional.

The stability of a material in ambient air/moisture and over a large range of temperatures is highly important for optoelectronic device applications. Based on periodic PXRD and the simultaneous measurements of TGA and DSC, CsCu$_2$X$_3$ showed good ambient air stability for more than two months (see FIG. 22 in U.S. Ser. No. 62/910,699), and an excellent thermal stability up to 495° C. with minimal mass loss after two heating-cooling cycles (see FIG. 23 in U.S. Ser. No. 62/910,699), which is a notable improvement over other well-known metal halides such as (CH$_3$NH$_3$)PbI$_3$ and (CH$_3$NH$_3$)$_3$Bi$_2$I$_9$. Moreover, CsCu$_2$X$_3$ family members exhibited congruent melting behavior, with melting occurring at 270° C., 351° C., and 374° C. for $CsCu_2Cl_3$, $CsCu_2Br_3$, and $CsCu_2I_3$, respectively. In addition, the presence of a small peak feature in each sample close to their melting transitions suggests the presence of a minor CsX impurity. Indeed, CsX impurities are known to form a lower melting eutectic together with $CsCu_2X_3$. Finally, photosensitivity of $CsCu_2X_3$ was checked through periodic measurements of PLQY under continuous irradiation at their respective $PLE_{max}$, which showed up to 10% loss in PLQY for the chloride and no change for the bromide and iodide samples.

Based on Kubelka-Munk plots (shown in FIG. 24 in U.S. Ser. No. 62/910,699), halide substitution led to tunable band gaps energies, ranging from 3.74 to 3.53 eV. The DFT calculation based on the PBE functional showed direct band gaps for $CsCu_2Cl_3$, $CsCu_2Br_3$, and $CsCu_2I_3$. The valence (conduction) band is made up of Cu-3d (Cu-4s) orbitals hybridized with halogen-p orbitals. The PBE band structure and density of states of $CsCu_2Cl_3$, which was chosen as a representative of the family, are shown in FIG. 25 in U.S. Ser. No. 62/910,699. Note that the PBE band gap is underestimated due to the well-known band-gap error in the PBE calculation. The band gap was further corrected using the hybrid PBE0 functional. The PBE0 band gaps of $CsCu_2Cl_3$, $CsCu_2Br_3$, and $CsCu_2I_3$ are 4.29 eV, 3.94 eV, and 3.93 eV, respectively. The calculated band gaps are higher than the measured PLE energies because the calculation does not take into account the exciton binding; however, the calculated band gap trend is consistent with that of the measured PLE energies.

Under 325 nm UV excitation at RT, $CsCu_2X_3$ showed highly Stokes-shifted emission from 527 to 587 nm with PLQYs values ranging from 0.38% ($CsCu_2Br_{1.5}I_{1.5}$) to 48.0% ($CsCu_2Cl_3$) and CIE 1931 chromaticity coordinates of (0.31, 0.55), (0.32, 0.53), and (0.46, 0.50) for $CsCu_2Cl_3$, $CsCu_2Br_3$, and $CsCu_2Cl_3$, respectively (Table 3 and FIG. 26 in U.S. Ser. No. 62/910,699). The observed bright RT emission resulted from strong quantum confinement and highly localized charges promoting a high exciton binding energy (few hundreds of meV, see below) and yielding high PLQY, which are often observed in low-dimensional metal halides. The excitation spectra (PLE) contained excitation peaks ranging from 319 nm for $CsCu_2Cl_3$ to 340 nm for $CsCu_2Cl_{1.5}Br_{1.5}$ (Table 3 and FIG. 26 in U.S. Ser. No. 62/910,699). Normalized PLE spectra measured for different emission wavelengths have identical shape and features, indicating that the emission in $CsCu_2X_3$ may have the same physical origin (see FIG. 27 in U.S. Ser. No. 62/910,699). The recorded Stokes shift and FWHM showed an increasing trend going from the chloride to the iodide member. In semiconductors, the presence of permanent defect states can create broadband emission. However, our power dependence PL measurements (see FIG. 28 in U.S. Ser. No. 62/910,699) showed linear behavior for all studied compounds, and the absence of saturation excludes the possibility of permanent defect emission. Therefore, the largely Stokes-shifted broadband emission of $CsCu_2X_3$ was attributed to STEs. It is worth noticing that the maximum PL of the single halides (where $X_3=Cl_3$, $Br_3$, or $I_3$) shows continuous red-shifts corroborated with an increase of the Stokes shifts; however, the mixed halides $CsCu_2Cl_{1.5}Br_{1.5}$ and $CsCu_2Br_{1.5}I_{1.5}$ do not follow a linear trend, and their maximum emission are red-shifted and lower in efficiency compared to the single halides (see Table 3). A similar behavior was also observed for $MAPb(IBr)_3$. These facts could be explained by the presence of more structural distortion in the mixed halide samples, which can affect the PL efficiency, the self-trapping depth within the band gap of the material, and lead to a red shift of the maximum PL.

FIG. 29 in U.S. Ser. No. 62/910,699 shows the RT time-resolved photoluminescence measurements of $CsCu_2X_3$. All decay profiles can be fitted using the two-exponential function represented by Equation (7):

$$I(t) = A_1 \times \exp\left(\frac{-t}{\tau_1}\right) + A_2 \times \exp\left(\frac{-t}{\tau_2}\right) + I_0. \tag{7}$$

The full refinement results are provided in Table 4. Excitons lifetimes vary between 13.8 and 62.0 ns, and show an increase going from Cl, to Br, to I, which is in agreement with those of homologous compounds such as $CsPbBr_3$ and inversely proportional to the measured PLQYs (48% for the Cl-, 18.3% for the Br-, and 3.23% for the I-based compounds). The STEs lifetime was discussed by Mott and Stoneham based on the consideration of an energy barrier that is required to be surmounted for STEs formation. The potential barrier between STEs and free-excitons should be higher for $CsCu_2I_3$ compared to $CsCu_2Cl_3$, which explains the longer relaxation time for excitons in $CsCu_2I_3$ compared to $CsCu_2Br_3$ and $CsCu_2Cl_3$.

TABLE 4

Summary of the Time-rResolved PL Refinement Results for $CsCu_2X_3$

| Sample | $CsCu_2Cl_3$ | $CsCu_2Cl_{1.5}Br_{1.5}$ | $CsCu_2Br_3$ | $CsCu_2Br_{1.5}I_{1.5}$ | $CsCu_2I_3$ |
|---|---|---|---|---|---|
| Excitation (nm) | 314 | 333 | 314 | 333 | 333 |
| Emission (nm) | 527 | 587 | 533 | 584 | 576 |
| $I_0$ | 152.5 ± 0.6 | 85 ± 0.5 | 49.9 ± 0.27 | 15.2 ± 0.5 | 35.2 ± 0.7 |
| $A_1$ | $8.8\ 10^{22} \pm 6.4\ 10^{22}$ | $1.5\ 10^{30} \pm 7.2\ 10^{29}$ | $7.7\ 10^{24} \pm 3\ 10^{24}$ | $2.9\ 10^3 \pm 241$ | $5.7\ 10^3 \pm 1.3\ 10^2$ |
| $\tau_1$ (ns) | 2.1 ± 0.04 | 1.6 ± 0.02 | 1.9 ± 0.01 | 72.2 ± 1.7 | 62 ± 2 |
| $A_2$ | $6.4\ 10^4 \pm 5.7\ 10^4$ | $3.9\ 10^4 \pm 2\ 10^4$ | $2.3\ 10^4 \pm 3.2\ 10^2$ | $4.2\ 10^4 \pm 2.6\ 10^3$ | 356 ± 197 |
| $\tau_2$ (ns) | 13.8 ± 0.6 | 15.1 ± 1.1 | 18 ± 0.01 | 26.6 ± 0.7 | 126.5 ± 20 |

To get further information about the STEs dynamics and the exciton-phonon interaction, the temperature dependence of PL for $CsCu_2X_3$ under 325 nm excitation was measured (Table 5 and FIG. 30 Panel (a) and FIG. 31 in U.S. Ser. No. 62/910,699). The PL intensity of $CsCu_2Cl_3$ showed a relatively small thermal quenching (~3 times) upon heating. However, the thermal quenching was much more significant for $CsCu_2I_3$ (~5 times) and the alloyed $CsCu_2Br_{1.5}I_{1.5}$ (~60 times). This is consistent with the trend of the measured PLQYs values (Table 3) and confirms that excitons are more thermally stable in $CsCu_2Cl_3$. Based on the temperature-dependent PL data, the thermal evolution of the integrated intensity, the position, and FWHM of PL peaks of $CsCu_2X_3$ was studied (see FIG. 30, Panels (b)-(d) in U.S. Ser. No. 62/910,699). In semiconductors, free exciton PL peak red-shifts upon heating following Varshni's model. Here, the position of PL peaks of $CsCu_2X_3$ slightly blue-shift upon heating, particularly for $CsCu_2I_3$ (see FIG. 30, Panel (b) in U.S. Ser. No. 62/910,699). Such a blue-shift was also observed in some metal halides and PbS quantum dots, and was attributed to the strong electron-phonon coupling. This is also consistent with the high lattice distortion of $CsCu_2I_3$ (Table 6).

TABLE 5

Temperature-Dependent PL Refinement for $CsCu_2X_3$

| Sample | $CsCu_2Cl_3$ | $CsCu_2Cl_{1.5}Br_{1.5}$ | $CsCu_2Br_3$ | $CsCu_2Br_{1.5}I_{1.5}$ | $CsCu_2I_3$ |
|---|---|---|---|---|---|
| Excitation (nm) | 314 | 333 | 314 | 333 | 333 |
| Emission (nm) | 527 | 587 | 533 | 584 | 576 |
| $I_0$ | 152.5 ± 0.6 | 85 ± 0.5 | 49.9 ± 0.27 | 15.2 ± 0.5 | 35.2 ± 0.7 |
| $A_1$ | $8.8\ 10^{22} \pm 6.4\ 10^{22}$ | $1.5\ 10^{30} \pm 7.2\ 10^{29}$ | $7.7\ 10^{24} \pm 3\ 10^{24}$ | $2.9\ 10^3 \pm 241$ | $5.7\ 10^3 \pm 1.3\ 10^2$ |
| $\tau_1$ (ns) | 2.1 ± 0.04 | 1.6 ± 0.02 | 1.9 ± 0.01 | 72.2 ± 1.7 | 62 ± 2 |
| $A_2$ | $6.4\ 10^4 \pm 5.7\ 10^4$ | $3.9\ 10^4 \pm 2\ 10^4$ | $2.3\ 10^4 \pm 3.2\ 10^2$ | $4.2\ 10^4 \pm 2.6\ 10^3$ | $356 \pm 197$ |
| $\tau_2$ (ns) | 13.8 ± 0.6 | 15.1 ± 1.1 | 18 ± 0.01 | 26.6 ± 0.7 | 126.5 ± 20 |

TABLE 6

Results of the Tetrahedral Distortion Evaluation Showing a Linear Decrease in Distortion with Increase in Halogen Size

| | $CsCu_2Cl_3$ | $CsCu_2Br_3$ | $CsCu_2I_3$ |
|---|---|---|---|
| $\sigma_{(tet)}^2$ | 49.49 | 14.22 | 10.33 |
| $<\lambda_{tet}>$ | 0.9785 | 0.9537 | 0.8984 |
| $\Delta d$ | $21.67 \times 10^{-4}$ | $13.59 \times 10^{-4}$ | $3.05 \times 10^{-4}$ |
| $\Delta\theta_{XMX}$ | $68.84 \times 10^{-4}$ | $19.44 \times 10^{-4}$ | $14.37 \times 10^{-4}$ |

Moreover, for non-alloy compounds $CsCu_2Cl_3$, $CsCu_2Br_3$ and $CsCu_2I_3$, the integrated PL intensity quenched upon cooling and then saturated at 100 K (FIG. 30, Panel (c) in U.S. Ser. No. 62/910,699). This thermal quenching can be described by the Arrhenius-type model in Equation (8):

$$I_{PL} = \frac{I_0}{\left(1 + a \times \exp\left(\frac{-E_b}{k_B T}\right)\right)}, \quad (8)$$

where $I_0$ is the low-temperature PL intensity, $k_B$ is the Boltzmann constant, $\alpha$ is the ratio between the radiative and the nonradiative decay rates, and $E_b$ is the exciton binding energy. The best fit gives $E_b$ of 201±6, 155±4, and 128±1, for $CsCu_2Cl_3$, $CsCu_2Br_3$, and $CsCu_2I_3$, respectively. These high $E_b$ values are much larger than that of the 3D perovskite $CsPbX_3$ (~18 meV), characteristic of low-dimensional materials as discussed earlier. Importantly, the trend of the exciton binding energy furthermore supports the increasing of the PLQYs values from 3.23 for $CsCu_2I_3$ to 48% for $CsCu_2Cl_3$. On the other hand, the integrated PL intensity of the alloy compounds $CsCu_2Cl_{1.5}Br_{1.5}$ and $CsCu_2Br_{1.5}I_{1.5}$, first increases with temperature from 4 to 80 K, then decreases at higher temperature (see FIG. 30, Panel (c) in U.S. Ser. No. 62/910,699). The initial increase of PL intensity with temperature, known as "negative thermal quenching," was already observed in semiconductors and metal halides, and attributed to phonon-assisted non-radiative recombination. These data can be refined using the Shibata model, which involves two competing processes: the quenching of the PL intensity with temperature due to thermal dissociation of the electron-hole pair and the subsequent decrease of the exciton population, and negative thermal quenching due to the thermal excitation of low-energy non-radiative STEs states towards the higher energy radiative STEs state responsible for the quenching of the PL of the two alloys compounds $CsCu_2Br_{1.5}I_{1.5}$ and $CsCu_2Br_{1.5}I_{1.5}$. In addition, detrapping of excitons, from STEs to free excitons states, may also lead to thermal quenching of the PL emission. Therefore, two activation energies were considered for the thermal quenching process, and the temperature dependence PL intensity is given by Equation (9):

$$I(T) = I_0 \frac{1 + c \times \exp(-E_c/k_B T)}{1 + a \times \exp(-E_a/k_B T) + b \times \exp(-E_b/k_B T)}, \quad (9)$$

where $I_0$ is the low temperature PL intensity. The activation energies $E_b$ is associated to exciton binding energy, $E_a$ is the self-trapped depth ($E_a = E_{FE} - E_{STE}$), $E_c$ describes the thermal quenching of the PL intensity, and a, b, and c are fitting parameters. The best refinement gives $E_a$=25±0.8 meV, $E_b$=138±5 meV, and $E_c$=5.9±0.4 meV for $CsCu_2Cl_{1.5}Br_{1.5}$ and $E_a$=29±5 (3) meV, $E_b$=98±8 meV, and $E_c$=12.2±0.7 meV for $CsCu_2Br_{1.5}I_{1.5}$. The obtained $E_a$ values are close to the RT thermal energy (~26 meV), so it would be reasonable to expect the free excitonic emission at RT. However, the absence of the free exciton peaks is likely due to the very broad STEs emission band compared to free-exciton emission. This also confirms the intrinsic nature of the trapping mechanism.

Moreover, the thermal broadening in linewidth of PL of $CsCu_2X_3$ (FIG. 30, Panel (c) in U.S. Ser. No. 62/910,699) originates from exciton-phonon coupling, and described by Equation (10):

$$\Gamma(T) = \Gamma_0 + \Gamma_{AC} \times T + \Gamma_{LO} \times \left(1 + \exp\left(\frac{E_{LO}}{k_B T}\right)\right)^{-1}, \quad (10)$$

where the first term is the natural line width at 0 K, the second term represents the broadening induced by acoustic phonons, and the third term corresponds to the contribution of optical phonons to the peak broadening. There, $\Gamma_{LO}$ is the exciton-phonon coupling constant and $E_{LO}$ is the optical phonon energy. The fitting gives $\Gamma_{LO}$ and $E_{LO}$ values ranging from 471 to 910 meV K$^{-1}$ and from 4.1 to 12.2 meV, respectively. These high exciton-phonon coupling constant values are one order of magnitude larger than those of lead-based 3D hybrid perovskites ($\Gamma_{LO}$ of 40-61 meV) and more than two times higher than the reported value of $Cs_3Bi_2I_6Cl_3$, supporting the strength of the electron-phonon coupling in $CsCu_2X_3$. Moreover, $E_{LO}$ values of 6.2 and 11.5 meV for $CsCu_2Cl_{1.5}Br_{1.5}$ and $CsCu_2Cl_{1.5}Br_{1.5}$, respectively, are in excellent agreement with the $E_c$ values of 5.9±0.4 meV and 12.2±0.7 meV deduced from the fitting of the PL intensity using Shibata's model. Together, these findings support the assignment of the broad PL emission of $CsCu_2X_3$ to phonon-assisted recombination of STEs.

Finally, LEDs were fabricated based on $CsCu_2X_3$ (see FIG. 21 in U.S. Ser. No. 62/910,699). In order to fabricate LEDs, a $CsCu_2I_3$ was used as a yellow additive in a 1,3-Bis(N-carbazolyl)benzene (mCP) host layer. The $CsCu_2I_3$-based LED showed a yellow emission light with the peak wavelength of 554 nm. The quantum efficiency of ~0.1% was achieved at the luminance of 1 cd/m$^2$.

In conclusion, the optical properties of nontoxic, remarkably stable, and highly emissive 1D metal halides $CsCu_2X_3$ are disclosed. Bright RT visible-emission was found, with PLQY reaching 48% for $CsCu_2Cl_3$, attributed to STEs. The photophysical properties of $CsCu_2X_3$ were investigated through temperature, power dependence, and time resolved PL measurements. High exciton binding energies ranging from 98 to 201 meV and high exciton-phonon coupling energies were estimated from the thermal evolution of PL intensity and FWHM. This supports the assignment of the broad PL emission of $CsCu_2X_3$ to phonon-assisted recombination of STEs. Importantly, this Example discloses the development of all-inorganic Pb-free halide light emitters $CsCu_2X_3$, a which constitutes a significant advancement in the development of solid-state lighting technologies based on inexpensive, nontoxic and earth-abundant materials.

Example 3—Potassium-Based Copper Halides

In a non-limiting embodiment, the compounds of the present disclosure may comprise the formula $K_2CuX_3$, (X=Br, Cl, I).

While the present disclosure has been described in connection with certain embodiments so that aspects thereof may be more fully understood and appreciated, it is not intended that the present disclosure be limited to these particular embodiments. On the contrary, it is intended that all alternatives, modifications, and equivalents are included within the scope of the present disclosure. Thus the examples described above, which include particular embodiments, will serve to illustrate the practice of the present disclosure, it being understood that the particulars shown are by way of example and for purposes of illustrative discussion of particular embodiments only and are presented in the cause of providing what is believed to be the most useful and readily understood description of procedures as well as of the principles and conceptual aspects of the presently disclosed methods. Changes may be made in various aspects of the methods described herein without departing from the spirit and scope of the present disclosure. For example, changes can be made in the order of method steps or sequence of method steps. The various elements, components, assemblies, and/or steps of the present disclosure may be combined or integrated in another system, or certain features may be omitted, or not implemented. In addition, techniques, systems, subsystems, and methods described and illustrated in the various embodiments as discrete or separate may be combined or integrated with other systems, components, techniques, or methods without departing from the scope of the present disclosure. Other items shown or discussed as coupled may be directly coupled or communicating with each other or may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An optoelectronic device comprising:
    a phosphor comprising an inorganic perovskite compound, the inorganic perovskite compound comprising:
        (a) an alkali metal selected from the group consisting of potassium (K), rubidium (Rb), and cesium (Cs);
        (b) copper (Cu); and
        (c) at least one halogen selected from the group consisting of chlorine (Cl), bromine (Br), and iodine (I);
    a transducer; and
    a single crystal layer comprising the inorganic perovskite compound,
    wherein the inorganic-perovskite compound is free of lead (Pb).

2. The optoelectronic device of claim 1, wherein the phosphor is a blue-light emitter.

3. The optoelectronic device of claim 1, wherein the inorganic perovskite compound has a formula selected from the group consisting of (a) $Rb_2CuX_3$; (b) $Rb_2CuBr_{3-y}I_y$, wherein $0 \le y \le 3$; (c) $Cs_3Cu_2X_5$; (d) $Cs_3Cu_2Br_{5-y}I_y$, wherein $0 \le y \le 5$; (e) $K_2CuX_3$; and (f) $K_2CuBr_{3-y}I_y$, wherein $0 \le y \le 3$; and wherein X of each of (a), (c), and (e) is selected from the group consisting of Br, Cl, and I.

4. An optoelectronic biosensor comprising:
    an inorganic perovskite compound comprising:
        (a) an alkali metal selected from the group consisting of potassium (K), rubidium (Rb), and cesium (Cs);
        (b) copper (Cu); and
        (c) at least one halogen selected from the group consisting of chlorine (Cl), bromine (Br), and iodine (I), and
    the biosensor having an emission intensity which is alterable relative to one or more biological factors, and wherein the inorganic perovskite compound is free of lead (Pb).

5. The optoelectronic biosensor of claim 4, wherein the inorganic perovskite compound has a formula selected from the group consisting of (a) $Rb_2CuX_3$; (b) $Rb_2CuBr_{3-y}I_y$, wherein $0 \le 3$; (c) $Cs_3Cu_2X_5$; (d) $Cs_3Cu_2Br_{5-y}I_y$, wherein $0 \le y \le 5$; (e) $K_2CuX_3$; and (f) $K_2CuBr_{3-y}I_y$, wherein $0 \le y \le 3$; and wherein X of each of (a), (c), and (e) is selected from the group consisting of Br, Cl, and I.

6. An optoelectronic temperature sensing device comprising:
    an inorganic perovskite compound comprising:
        (a) an alkali metal selected from the group consisting of potassium (K), rubidium (Rb), and cesium (Cs);
        (b) copper (Cu); and
        (c) at least one halogen selected from the group consisting of chlorine (Cl), bromine (Br), and iodine (I), and
    the temperature sensing device having an emission intensity which is alterable relative to temperature, and wherein the inorganic perovskite compound is free of lead (Pb).

7. The optoelectronic temperature sensing device of claim 6, wherein the inorganic perovskite compound has a formula selected from the group consisting of (a) $Rb_2CuX_3$; (b) $Rb_2CuBr_{3-y}I_y$, wherein $0 \le y \le 3$; (c) $Cs_3Cu_2X_5$; (d) $Cs_3Cu_2Br_{5-y}I_y$, wherein $0 \le y \le 5$; (e) $K_2CuX_3$; and (f) $K_2CuBr_{3-y}I_y$, wherein $0 \le y \le 3$; and wherein X of each of (a), (c), and (e) is selected from the group consisting of Br, Cl, and I.

8. An object susceptible to counterfeiting, comprising:
    an anti-counterfeit nanotaggant which comprises luminescent copper-containing nanoparticles, the luminescent copper-containing nanoparticles comprising at least one inorganic perovskite compound, wherein the anti-counterfeit nanotaggant is positioned on and/or within at least a portion of a surface of the object, and wherein the luminescent copper-containing nanoparticles emit a predetermined emission wavelength when exposed to a predetermined excitation wavelength, and wherein the inorganic perovskite compound comprises:
        (a) an alkali metal selected from the group consisting of potassium (K), rubidium (Rb), and cesium (Cs);
        (b) copper (Cu); and
        (c) at least one halogen selected from the group consisting of chlorine (Cl), bromine (Br), and iodine (I).

9. The object of claim 8, wherein the inorganic perovskite compound is free of lead (Pb).

10. The object of claim 8, wherein the anti-counterfeit nanotaggant is applied to the object in a predetermined pattern that is invisible until exposed to the excitation wavelength.

11. The object of claim 8, wherein the inorganic perovskite compound has a formula selected from the group consisting of (a) $Rb_2CuX_3$; (b) $Rb_2CuBr_{3-y}I_y$, wherein $0 \leq y \leq 3$; (c) $Cs_3Cu_2X_5$; (d) $Cs_3Cu_2Br_{5-y}I_y$, wherein $0 \leq y \leq 5$; (e) $K_2CuX_3$; and (f) $K_2CuBr_{3-y}I_y$, wherein $0 \leq y \leq 3$; and wherein X of each of (a), (c), and (e) is selected from the group consisting of Br, Cl, and I.

* * * * *

UNITED STATES PATENT AND TRADEMARK OFFICE
CERTIFICATE OF CORRECTION

PATENT NO. : 11,591,516 B2
APPLICATION NO. : 17/063438
DATED : February 28, 2023
INVENTOR(S) : Bayram Saparov et al.

It is certified that error appears in the above-identified patent and that said Letters Patent is hereby corrected as shown below:

In the Specification

Column 7, Line 7: Delete "0≤3;" and replace with -- $0 \leq y \leq 3$; --

Column 7, Line 24: After "a phototransistor," delete "a"

In the Claims

Column 24, Line 6, Claim 3: Delete "023 y≤3;" and replace with -- $0 \leq y \leq 3$; --

Column 24, Line 25, Claim 5: Delete "0≤3;" and replace with -- $0 \leq y \leq 3$; --

Signed and Sealed this
Second Day of May, 2023

*Katherine Kelly Vidal*
Katherine Kelly Vidal
*Director of the United States Patent and Trademark Office*